US008330412B2

(12) United States Patent
Lattin

(10) Patent No.: US 8,330,412 B2
(45) Date of Patent: Dec. 11, 2012

(54) MONITORING AND CONTROL SYSTEM FOR AN ELECTRICAL STORAGE SYSTEM OF A VEHICLE

(75) Inventor: Robert M. Lattin, Minneapolis, MN (US)

(73) Assignee: Thermo King Corporation, Minneapolis, MN (US)

( * ) Notice: Subject to any disclaimer, the term of this patent is extended or adjusted under 35 U.S.C. 154(b) by 551 days.

(21) Appl. No.: 12/534,005

(22) Filed: Jul. 31, 2009

(65) Prior Publication Data

US 2011/0025273 A1 Feb. 3, 2011

(51) Int. Cl.
*H02J 7/14* (2006.01)
(52) U.S. Cl. ....................................................... 320/104
(58) Field of Classification Search .................... 320/104
See application file for complete search history.

(56) References Cited

U.S. PATENT DOCUMENTS

| | | | |
|---|---|---|---|
| 3,545,222 A | 12/1970 | Petranek | |
| 3,946,574 A | 3/1976 | Portera | |
| 3,974,660 A | 8/1976 | Farr | |
| 4,015,182 A | 3/1977 | Erdman | |
| 4,280,330 A | 7/1981 | Harris et al. | |
| 4,459,519 A | 7/1984 | Erdman | |
| 4,864,154 A | 9/1989 | Copeland et al. | |
| 4,909,044 A | 3/1990 | Gudmundsen | |
| RE33,687 E | 9/1991 | Greer | |
| 5,333,678 A | 8/1994 | Mellum et al. | |
| 5,497,941 A | 3/1996 | Numazawa et al. | |
| 5,555,737 A | 9/1996 | Takeo et al. | |
| 5,619,862 A | 4/1997 | Ruger et al. | |
| 5,652,069 A | 7/1997 | Sakai et al. | |
| 5,670,864 A * | 9/1997 | Marx et al. .................... 323/211 | |
| 5,896,750 A | 4/1999 | Karl | |
| 5,899,081 A | 5/1999 | Evans et al. | |
| 5,901,572 A | 5/1999 | Peiffer et al. | |
| 6,038,877 A | 3/2000 | Peiffer et al. | |
| 6,059,016 A | 5/2000 | Rafalovich et al. | |
| 6,094,926 A | 8/2000 | Nakayama et al. | |
| 6,211,653 B1 * | 4/2001 | Stasko ......................... 320/149 | |
| 6,276,161 B1 | 8/2001 | Peiffer et al. | |
| 6,351,957 B2 | 3/2002 | Hara | |
| 6,412,293 B1 | 7/2002 | Pham et al. | |
| 6,453,678 B1 | 9/2002 | Sundhar | |
| 6,457,324 B2 | 10/2002 | Zeigler et al. | |
| 6,470,960 B2 | 10/2002 | Kampf et al. | |
| 6,626,003 B1 | 9/2003 | Kortuem et al. | |
| 6,639,386 B2 | 10/2003 | Shiojima | |
| 6,661,231 B1 | 12/2003 | Arai et al. | |
| 6,681,588 B2 | 1/2004 | Zeigler | |
| 6,688,121 B2 | 2/2004 | Tada et al. | |
| 6,688,125 B2 | 2/2004 | Okamoto et al. | |
| 6,701,221 B1 | 3/2004 | Eaton et al. | |
| 6,731,098 B1 | 5/2004 | Hintz et al. | |
| 6,745,585 B2 | 6/2004 | Kelm et al. | |
| 6,755,041 B2 | 6/2004 | Wessells et al. | |
| 6,796,367 B2 | 9/2004 | Blacquiere et al. | |
| 6,814,299 B1 | 11/2004 | Carey | |
| 6,838,858 B2 | 1/2005 | Berneis et al. | |
| 6,874,695 B2 | 4/2005 | Baker et al. | |
| 6,889,762 B2 | 5/2005 | Zeigler et al. | |
| 6,980,911 B2 | 12/2005 | Eaton et al. | |
| 7,005,760 B2 | 2/2006 | Eaton et al. | |
| 7,007,491 B2 | 3/2006 | Grimm et al. | |
| 7,030,580 B2 | 4/2006 | Hoff | |
| 7,042,180 B2 | 5/2006 | Terry et al. | |
| 7,055,486 B2 | 6/2006 | Hoff et al. | |
| 7,092,848 B2 | 8/2006 | Hoff et al. | |
| 7,114,482 B2 | 10/2006 | Lane | |
| 7,189,158 B2 | 3/2007 | Motszko et al. | |
| 7,234,315 B2 | 6/2007 | Allen et al. | |
| 7,237,397 B2 | 7/2007 | Allen | |
| 7,256,516 B2 | 8/2007 | Buchanan et al. | |
| 7,259,469 B2 | 8/2007 | Brummett et al. | |
| 7,259,481 B2 | 8/2007 | Eaton et al. | |
| 7,276,815 B2 | 10/2007 | Algrain et al. | |
| 7,316,119 B2 | 1/2008 | Allen | |
| 7,400,059 B2 | 7/2008 | Algrain et al. | |
| 7,424,343 B2 | 9/2008 | Kates | |
| 7,448,227 B2 | 11/2008 | Zeigler et al. | |
| 7,454,922 B2 | 11/2008 | Zeigler et al. | |
| 7,462,970 B2 | 12/2008 | Hoff et al. | |
| 7,591,143 B2 | 9/2009 | Zeigler et al. | |
| 7,591,303 B2 | 9/2009 | Zeigler et al. | |
| 7,714,736 B2 * | 5/2010 | Gielniak ..................... 340/636.1 | |
| 7,960,945 B1 * | 6/2011 | Onorato et al. ............... 320/132 | |
| 2001/0024104 A1 * | 9/2001 | Suzuki ........................ 320/104 | |
| 2003/0070849 A1 | 4/2003 | Whittaker | |
| 2004/0157113 A1 * | 8/2004 | Klang ............................. 429/50 | |
| 2004/0168454 A1 | 9/2004 | Iritani | |
| 2004/0187505 A1 | 9/2004 | Hoff et al. | |
| 2004/0187834 A1 | 9/2004 | Hoff et al. | |
| 2004/0189099 A1 | 9/2004 | Wild | |
| 2004/0231831 A1 | 11/2004 | Houck et al. | |
| 2005/0016713 A1 | 1/2005 | Houck et al. | |
| 2005/0063121 A1 | 3/2005 | Jordan | |
| 2005/0135034 A1 | 6/2005 | Johnson et al. | |
| 2005/0161221 A1 | 7/2005 | Diamond et al. | |
| 2006/0173586 A1 | 8/2006 | Swanson | |
| 2007/0052241 A1 | 3/2007 | Pacy | |
| 2007/0131408 A1 | 6/2007 | Zeigler et al. | |
| 2007/0151273 A1 | 7/2007 | Nelson et al. | |

(Continued)

FOREIGN PATENT DOCUMENTS

EP 1024038 2/2000

*Primary Examiner* — Arun Williams
(74) *Attorney, Agent, or Firm* — Michael Best & Friedrich LLP

(57) ABSTRACT

A method of monitoring an electrical storage system. The method includes providing an electrical storage element defining a total storage capacity and having a state of charge cooperatively defining a total stored charge of the electrical storage element, determining a total stored charge value representative of the total stored charge of the electrical storage element, varying the total stored charge by charging the electrical storage element from the power source via an electrical charge or discharging the electrical storage element to the load via an electrical discharge, and updating the total stored charge value after varying the total stored charge.

4 Claims, 3 Drawing Sheets

U.S. PATENT DOCUMENTS

| | | |
|---|---|---|
| 2007/0179015 A1 | 8/2007 | Johnson et al. |
| 2007/0221370 A1 | 9/2007 | Allen et al. |
| 2008/0006045 A1 | 1/2008 | Brummett |
| 2008/0110189 A1 | 5/2008 | Alston et al. |
| 2008/0136257 A1 | 6/2008 | Flanigan et al. |
| 2008/0163633 A1 | 7/2008 | Magri et al. |
| 2008/0164082 A1 | 7/2008 | Foreman |
| 2008/0196436 A1 | 8/2008 | Connell et al. |
| 2008/0196877 A1 | 8/2008 | Zeigler et al. |
| 2008/0257622 A1 | 10/2008 | Teschner et al. |

* cited by examiner

MONITORING AND CONTROL SYSTEM FOR AN ELECTRICAL STORAGE SYSTEM OF A VEHICLE

BACKGROUND

The present invention relates to a monitoring and control system for electrical storage elements of a vehicle, and more particularly, the present invention relates to a monitoring system for monitoring power into and out of the electrical storage elements.

Large vehicles (e.g., semi-tractors, trucks, etc.) are commonly used to transport cargo. Existing tractors in a tractor-trailer combination typically include cabins that are conditioned by air conditioning systems. Often, electrical energy from a power source is stored in one or more batteries of the vehicle to provide stored electrical energy for later use when the power source is unavailable. In some vehicles, groups of batteries are provided for supplying power to electrical components of the vehicle.

Current transport HVAC systems typically use a low-voltage-disconnect device to prevent the batteries from discharging to a point where the truck engine does not start. Alternatively, some HVAC systems may use a simple time-based load reduction scheme to improve the runtime of the HVAC system when power is supplied from the batteries.

SUMMARY

The invention provides an iterative process that determines the total stored charge in a battery based on the amount of electrical charge flowing into or out of the battery and the total storage capacity of the battery. The process accurately determines the total stored charge so that a precise load run-time prediction and an accurate determination of whether the charge in the battery is reaching or approaching a battery life threshold can be made. Determining an accurate load run-time and the state of charge of the battery protects the battery by limiting battery discharge such that the cycle life of the battery can be maintained or extended. The run-time prediction and the relationship between the total stored charge and the battery life threshold are made more accurate upon subsequent iterations of the process.

In one construction, the invention provides a method of monitoring an electrical storage system. The method includes providing an electrical storage element defining a total storage capacity and having a state of charge cooperatively defining a total stored charge of the electrical storage element, determining a total stored charge value representative of the total stored charge of the electrical storage element, varying the total stored charge by charging the electrical storage element from the power source via an electrical charge or discharging the electrical storage element to the load via an electrical discharge, and updating the total stored charge value after varying the total stored charge.

In another construction, the invention provides a method of monitoring an electrical storage system for a vehicle having a power source. The electrical storage system includes an electrical storage element that defines a total storage capacity and that has a state of charge cooperatively defining a total stored charge of the electrical storage element. The method includes determining a total stored charge value representative of the total stored charge of the electrical storage element, and operating the electrical storage element in a charge phase and increasing the state of charge by supplying an electrical charge from the power source. The method also includes determining a charging condition of the electrical storage element, determining a predictive total stored charge value representative of the total stored charge of the electrical storage element based on the charging condition, and updating the total stored charge value of the electric storage element based on the predictive total stored charge value.

In yet another construction, the invention provides a method of monitoring an electrical storage system for a vehicle having a power source. The electrical storage system includes an electrical storage element that defines a total storage capacity and that has a state of charge cooperatively defining a total stored charge of the electrical storage element. The method includes determining a total stored charge value representative of the total stored charge of the electrical storage element, operating the electrical storage element in a discharge phase and decreasing the state of charge by discharging an electrical charge to the load, and determining a run-time of the load based on the total stored charge value. The method also includes determining a discharging condition of the electrical storage element, determining a predictive total stored charge value representative of the total stored charge of the electrical storage element based on the discharging condition, and updating the total stored charge value of the electric storage element based on the predictive total stored charge value.

Other aspects of the invention will become apparent by consideration of the detailed description and accompanying drawings.

DETAILED DESCRIPTION

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items.

Figure 1:
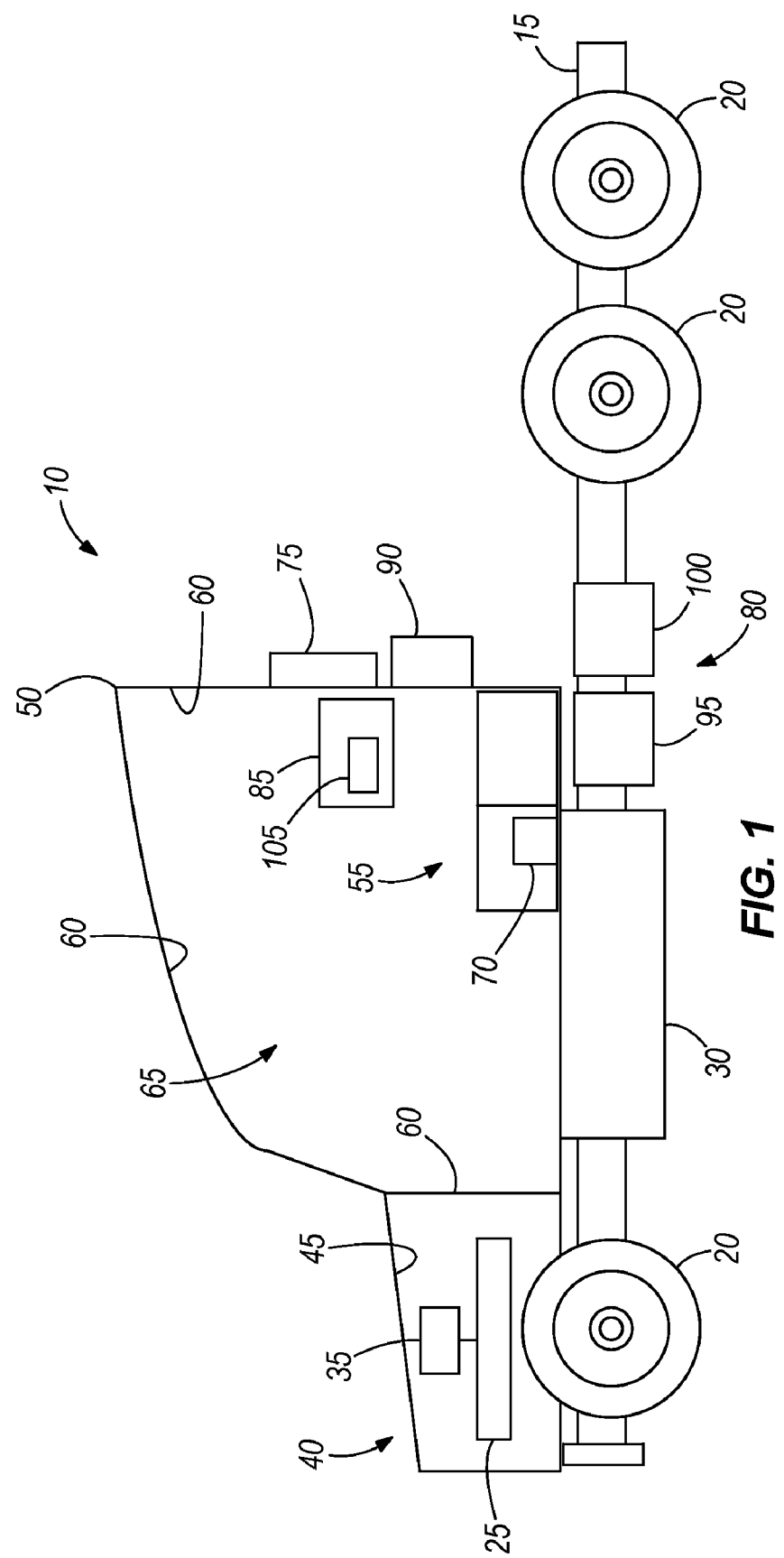
FIG. 1 is a schematic view of a vehicle including a control system, an electrical storage system, a power source, and an air conditioning system.

FIG. 1 shows a vehicle 10 for over-the-road operation embodying the invention. The illustrated vehicle 10 is a semi-tractor that is used to transport cargo stored in a cargo compartment (e.g., a container, a trailer, etc.) or people to one or more destinations, although other vehicles (e.g., a straight truck, a van, a bus, a car, etc.) are also considered. Hereinafter, the term "vehicle" shall be used to represent all such vehicles, and shall not be construed to limit the invention's application solely to a tractor in a tractor-trailer combination.

The vehicle 10 includes a frame 15, wheels 20, a prime mover 25, a fuel reservoir 30, and a direct current ("DC") generator or alternator 35. The prime mover 25 is in communication with one or more of the wheels 20 to drive the vehicle 10. The wheels 20 are rotatably coupled to the frame 15 to permit movement of the vehicle 10. The alternator 35 is coupled to the prime mover 25 so that mechanical energy produced by the prime mover 25 can be converted into electrical energy, or electricity. The alternator 35 and the prime mover 25 cooperate to define a first electrical power source 40 for the vehicle 10. The first power source 40 is operable in an "On" state and an "Off" state (e.g., when the first power source 40 is in standby mode or disconnected), and has a first power capacity that is based on the available electrical power (e.g., electrical charge) from the alternator 35 at a predetermined voltage.

The prime mover 25 is coupled to the frame 15 and is disposed in a compartment 45 adjacent a forward end of the vehicle 10. The prime mover 25 is operable in a first mode and a second mode, and includes an "On" state and an "Off" state. The first mode corresponds to the prime mover 25 being engaged so that power is provided to the wheels 20 so that the vehicle 10 can be driven in the first mode. The first mode further corresponds to when the prime mover 25 is idling, but is not engaged so that the operator can drive the vehicle 10. In other words, the prime mover 25 is operable in the first mode when the prime mover 25 is in the "On" state. The prime mover 25 is in the second mode during standby operation of the vehicle 10 (e.g., when the vehicle is parked, etc.). Generally, standby operation of the vehicle 10 corresponds to the prime mover 25 being disengaged. In other words, the prime mover 25 is in the second mode when the prime mover 25 is in the "Off" state.

Referring to FIG. 1, the vehicle 10 also includes a cabin 50 and a heating, ventilation, and air conditioning ("HVAC") system 55. The cabin 50 is supported on the frame 15 rearward of the compartment 45 and includes walls 60 that define a space 65. In some constructions, the space 65 may be divided into a driving portion and a sleeping portion. The HVAC system 55 is coupled to the vehicle 10 and is in communication with the cabin 50 to condition the space 65. The illustrated vehicle 10 includes a single HVAC system 55 that is located adjacent and in communication with the space 65. In other constructions, the HVAC system 55 can be positioned in the vehicle to condition the sleeping portion, and another HVAC system can be positioned in the vehicle to condition the driving portion. Generally, the number of HVAC systems in the vehicle depends at least in part on the size and number of zones to be conditioned within the cabin.

The HVAC system 55 defines an exemplary electrical load of the vehicle 10. The vehicle 10 also may include other electrical loads (e.g., vehicle accessories, lights, etc.). Generally, the electrical load has predetermined power characteristics that define a load draw, which corresponds to the electrical power that is necessary for adequately powering the load. The HVAC system 55 is operable in an "On" state (e.g., an active state) and an "Off" state (e.g., an inactive or disconnected state).

Components of the HVAC system 55 can be located anywhere on the vehicle 10. In the illustrated construction, the HVAC system 55 includes an evaporator assembly 70 that is located in the cabin 50 to condition the space 65, and a condenser assembly 75 that is coupled to one of the walls 60 on an exterior side of the cabin 50 to provide heat exchange between refrigerant in the HVAC system 55 and an ambient environment. In some constructions, the components of the HVAC system 55 can be assembled together into a single, unitary package. In other constructions, each component of the HVAC system 55 can be separate from the other components of the HVAC system 55.

The vehicle 10 also includes an electrical storage system 80 and a control system 85 in communication with the electrical storage system 80. The electrical storage system 80 is in electrical communication with the electrical load of the vehicle (e.g., the HVAC system 55) to provide adequate power to the electrical load based on the load draw. The electrical storage system 80 also is in electrical communication with the first power source 40 for receiving electrical power when the prime mover 25 is in the first mode. The electrical storage system 80 also may be in selective electrical communication with a second electrical power source 90 in addition to or in lieu of the first power source 40 for receiving electrical power from the second power source 90. In the illustrated construction, the second power source 90 can include shore power, a photovoltaic device, a fuel cell, a wind generator, or other sources of power. The second power source 90 is operable in an "On" state and an "Off" state (e.g., when the second power source 90 is in standby mode or disconnected), and has a second power capacity that is based on the available electrical power (e.g., electrical charge) from the power source 90 at a predetermined voltage.

Each of the first power source 40 and the second power source 90 defines a connected power source when the respective power sources 40, 90 are connected to the electrical storage system 80 (e.g., when either or both of the power sources 40, 90 are in the "On" state). Each of the first power source 40 and the second power source 90 defines a disconnected power source (e.g., when the power source is in the "Off" state or in the standby mode) when the respective power sources 40, 90 are disconnected from the electrical storage system 80. One or both of the first power source 40 and the second power source 90 can be connected to or disconnected from the electrical storage system 80.

The electrical storage system 80 is operable in a charge phase, a discharge phase, and a standby phase, and includes a first bank of electrical storage elements or batteries 95 and a second bank of electrical storage elements or batteries 100. The batteries 95, 100 receive and store electrical energy from one or both of the first power source 40 and the second power source 90 during the charge phase, and discharge or deliver power (e.g., electrical discharge) to the electrical load during the discharge phase. The batteries 95, 100 are in the standby phase when the first power source 40 and the second power source are in the respective "Off" states and the batteries 95, 100 are disconnected from the load. The second bank of batteries 100 can be charged concurrently with or separate from (e.g., consecutively) the first bank of batteries 95. The batteries 100 also can be used to power one or more dedicated loads, or to assist the batteries 95 in providing power to the same load or loads. In other constructions, the vehicle 10 may only include the first bank of batteries 95.

Each battery 95, 100 defines a total storage capacity or battery capacity that is at least partially based on predetermined design characteristics, environmental conditions in which the batteries are implemented (e.g., temperature or humidity of the surrounding environment, etc.), and time-related conditions (e.g., battery aging). The first and second banks of batteries 95, 100 can have substantially the same or different design characteristics (e.g., capacity, charge voltage, charge interval, etc.). The total storage capacity of each of the batteries 95, 100 is the amount of electrical energy that the respective batteries 95, 100 are able to store for later use.

Each battery 95, 100 has a state of charge (e.g., 40 percent charge, 90 percent charge, etc.) based on the predetermined design characteristics and the amount of electrical energy that is stored in each of the batteries 95, 100. Generally, the state of charge is a ratio of the amount of stored electrical energy in each of the batteries 95, 100 relative to the total storage capacity of the associated battery 95, 100. The state of charge and the total storage capacity for each battery 95, 100 cooperate to define an energy potential or total stored charge of the associated battery 95, 100. In the discharge phase, the total stored charge corresponds to the amount of electrical charge that each battery 95a-d, 100a-c can supply to the load over a period of time. In the charge phase, the total stored charge corresponds to the amount of charge that the batteries 95, 100 have received and stored from the connected power source. For example, when the state of charge of one or more of the batteries 95, 100 is 100% of the total storage capacity, the corresponding total stored charge is equal to the total storage capacity (i.e., the batteries 95, 100 have a full charge). When the state of charge of one or more of the batteries 95, 100 is 50% of the total storage capacity, the corresponding total stored charge is equal to 50% of the total storage capacity.

The control system 85 includes a controller 105 that is in electrical communication with the power sources 40, 90 to determine the power capacity of the power sources and whether the respective power sources 40, 90 are connected to the batteries 95, 100. If one or both of the power sources 40, 90 are connected, the controller 105 is operable to determine an electrical charge provided by the connected power source.

The controller 105 is in electrical communication with the batteries 95, 100 to connect and disconnect the batteries 95, 100 relative to the first power source 40 and/or the second power source 90 during the charge phase, and to connect and disconnect the batteries 95, 100 relative to the electrical load during the discharge phase. The controller 105 also is in electrical communication with the batteries 95, 100 to determine one or more operating conditions of the respective batteries 95, 100 based on power characteristics (e.g., voltage input, voltage output, current input, current output, temperature, etc.) of the batteries 95, 100, and to determine the total storage capacity of the batteries 95, 100. The operating conditions determined by the controller 105 can include whether one or more of the batteries 95, 100 are subjected to an over-current condition during the charge phase, whether the total stored charge in each battery 95, 100 is adequate for supplying power to the electrical load, and whether one or more of the batteries 95, 100 are approaching or near an end of charge life threshold (i.e., the end of one discharge phase of the batteries 95, 100). The charge life threshold for each battery 95, 100 is a predetermined threshold that is based on optimizing or extending the cycle life of the battery 95, 100. The operating conditions also may include other characteristics of the batteries 95 and the batteries 100 (e.g., voltage conditions, battery life, charge capacity, battery load, etc.) Generally, the operating conditions affect the total storage capacity, the state of charge, and the total stored charge of the respective batteries 95, 100.

Figure 2:
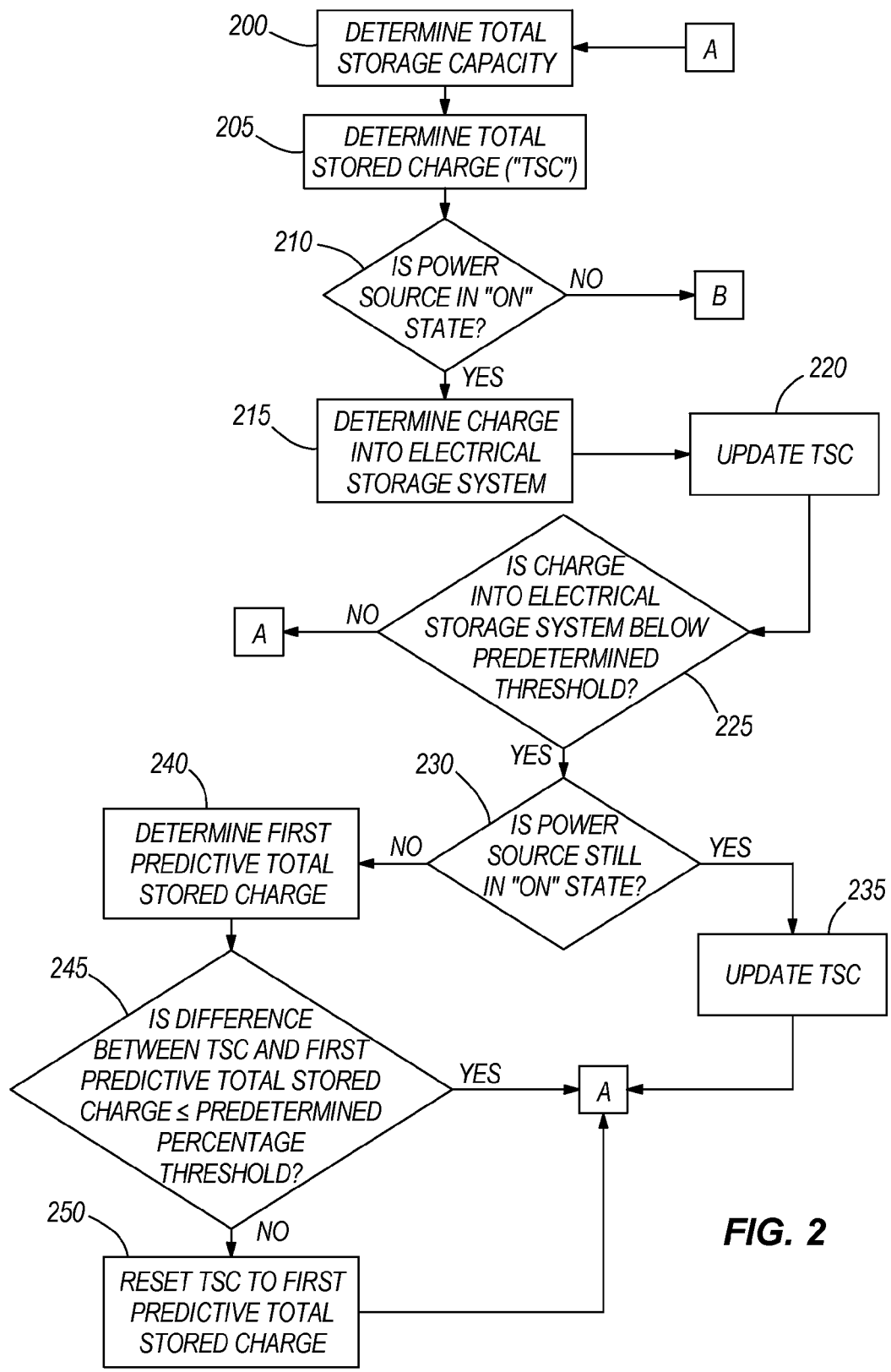
FIG. 2 is a flow chart of a control process for the electrical storage system.
Figure 3:
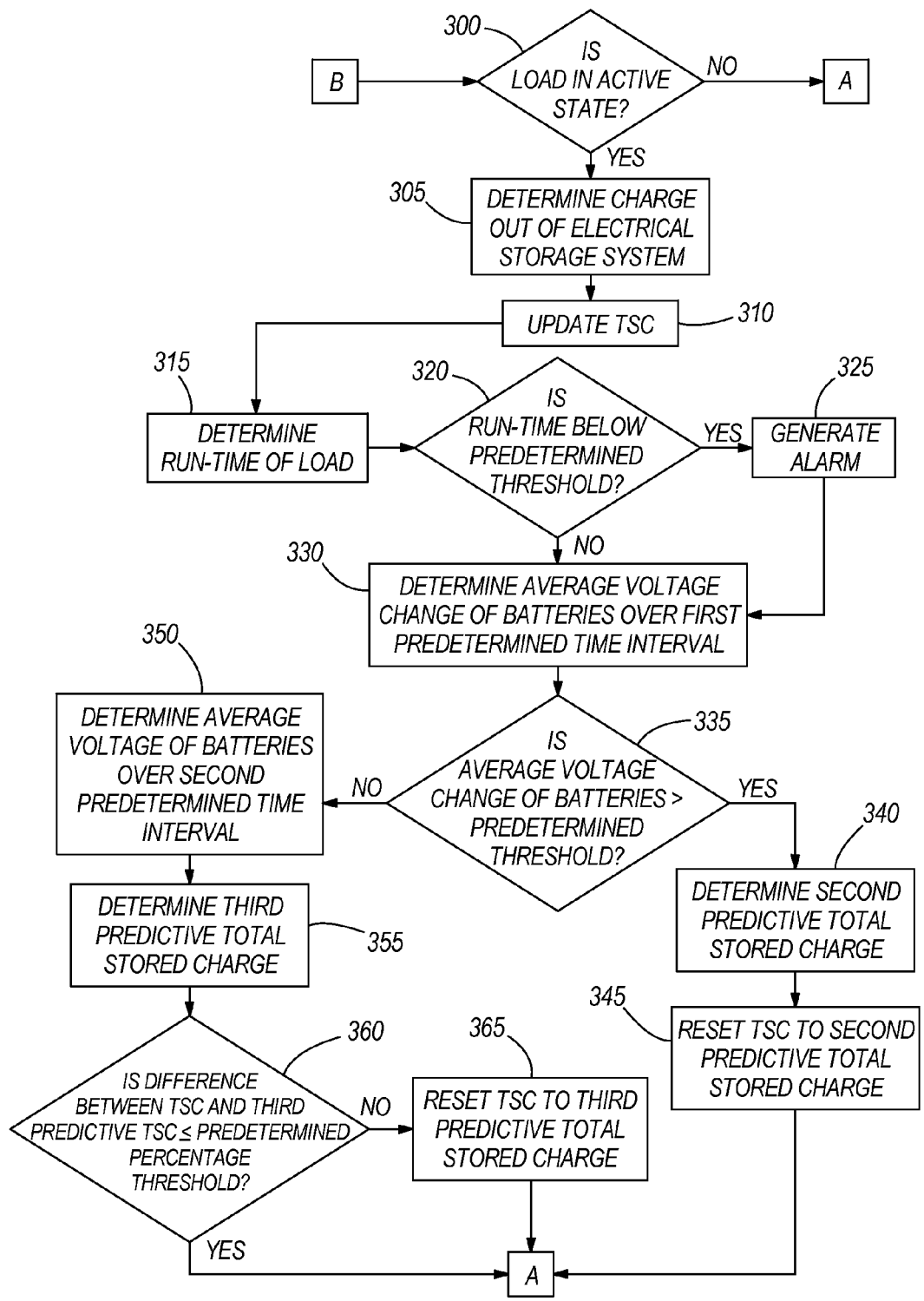
FIG. 3 is another flow chart of the control process for the electrical storage system.

The first and second banks of batteries 95, 100 are operable in the charge phase, the discharge phase, and the standby phase. FIGS. 2 and 3 show one construction of operation of a battery monitoring and control process for the electrical storage system 80 in the charge phase, the discharge phase, and the standby phase. Although operation of the batteries 95, 100 in the respective phases is described below as being applicable to all of the batteries 95, 100, it should be understood that one or more of the batteries 95, 100 can be operated in one of the charge phase, the discharge phase, and the standby phase while the remaining batteries 95, 100 can be operated in another of the charge phase, the discharge phase, and the standby phase. In other words, the batteries 95, 100 may be dependent or independent relative to each other. The process described with regard to FIGS. 2 and 3 may be applicable to one or more of the batteries 95, 100, and should not be construed as being applicable only to all of the batteries 95, 100.

At step 200 the controller 105 determines the total storage capacity of each of the batteries 95, 100 based on the associated predetermined design characteristics, the environmental conditions, and the time-related conditions. Initially, the total storage capacity can be determined based on manufacturer labels or other information that is indicative of the total storage capacity. In addition or alternatively, the total storage capacity may be sensed by the controller 105. Upon subsequent iterations of the process described with regard to FIGS. 2 and 3, the controller 105 can take the operating conditions, the environmental conditions, and the time-related conditions into account when determining the total storage capacity.

At step 205 the controller 105 determines a total stored charge of each of the batteries 95, 100. Initially, the total stored charge can be ascertained based on the total storage capacity determined at step 200 and an initial state of charge of the respective batteries 95, 100. The initial state of charge is an estimate of the state of charge of the batteries 95, 100 when the actual state of charge is unknown. Alternatively, the total stored charge determined at step 205 can be ascertained based on a last known amount of stored charge in the batteries 95, 100 (e.g., the last known amount of total stored charge based on the iterative control process described with regard to FIG. 2 and FIG. 3). In some constructions, the initial state of charge can be periodically adjusted or incremented upon subsequent iterations of the process described with regard to FIGS. 2 and 3 rather than using the last known amount of stored charge to avoid large discrepancies between the initial state of charge and the actual state of charge. The total stored charge determined by the controller 105 at step 205 is a value representative of the actual total stored charge of the electrical storage element defined by the total storage capacity and the actual state of charge of the batteries 95, 100. Depending on the accuracy of the initial state of charge relative to the actual state of charge of the batteries 95, 100, the total stored charge determined at step 205 may be substantially the same as or slightly different from the actual total stored charge of the batteries 95, 100.

At step 210 the controller 105 determines whether one or both of the first power source 40 and the second power source 90 are in the "On" state (i.e., whether the electrical storage system 80 is in the charge phase). If the controller 105 determines that the power sources 40, 90 are in the "Off" state ("No" at step 210), no electrical charge is supplied to the batteries 95, 100 and the process moves to step 300 (see FIG. 3).

If either or both of the power sources 40, 90 are in the "On" state ("Yes" at step 210), the controller 105 determines that the connected power source is supplying an electrical charge to the electrical storage system 80, and that the batteries 95, 100 are in the charge phase. At step 215 the controller 105 measures or detects the electrical charge into the electrical storage system 80 over a first predetermined period of time (e.g., 5 minutes, 10 minutes, etc.). At step 220, the controller 105 updates the total stored charge of the batteries 95, 100 based on the total stored charge determined at step 205 and the electrical charge measured at step 215 (e.g., the electrical charge measured at step 215 is added to the total stored charge determined at step 205).

After the total stored charge has been updated, the controller 105 determines at step 225 whether the electrical charge provided by the connected power source is below a predetermined charge threshold for a predetermined time period (e.g., 30 seconds, 1 minute, etc.). If the electrical charge into the batteries 95, 100 is equal to or above the predetermined charge threshold (i.e., "No" at step 225), the process returns to step 200.

When the electrical charge into the batteries 95, 100 is below the predetermined charge threshold (i.e., "Yes" at step 225), the controller 105 ascertains whether one or both of the power sources 40, 90 are still in the "On" state at step 230. The state of the power sources 40, 90 determined at step 230 is indicative of a charging condition of the batteries 95, 100 (e.g., whether the electrical charge into the batteries 95, 100 is zero or non-zero). In other constructions, the controller 105 may determine other charging conditions of the electrical storage system 80 at step 230. When the controller 105 determines that one or both of the power sources 40, 90 are still in the "On" state (i.e., "Yes" at step 230), the controller 105 determines that one or both of the power sources 40, 90 are connected and that the electrical charge into the batteries 95, 100 is non-zero. The connected state of the power sources 40, 90 and the non-zero electrical charge supplied by the connected power source 40, 90 is indicative of a state of charge of the batteries 95, 100 that is substantially 100 percent of the total storage capacity. In other words, the controller 105 determines that the batteries 95, 100 are fully charged at step 230 and updates the total stored charge at step 235 to equal the total storage capacity. The process then returns to step 200.

When the first power source 40 and the second power source 90 are in the "Off" state ("No" at step 230), the controller 105 determines a first predictive total stored charge of the batteries 95, 100 at step 240. Generally, the first predictive total stored charge is a value representative of the actual total stored charge of the electrical storage element, and differs from the total stored charge determined at step 205 and the updated total stored charge at step 220 in that the first predictive total stored charge accounts for various conditions affecting the total stored charge of the batteries 95, 100. For example, the first predictive total stored charge can be determined based on the environment conditions, the time-related conditions, the operating conditions, the measured electrical charge into the electrical storage system 80 determined at step 215, and the total storage capacity of the batteries 95, 100. In some constructions, the first predictive total stored charge may be based on a formula or look-up table. In other constructions, the first predictive total stored charge may be based on other or additional criteria and data.

At step 245 the controller 105 compares the updated total stored charge determined at step 220 and the first predictive total stored charge determined at step 240 to evaluate whether the difference between the first predictive total stored charge and the updated total stored charge is less than or equal to a first predetermined percentage threshold (e.g., 10 percent). Generally, the difference between the total stored charges corresponds to a percentage difference that is determined by subtracting the first predictive total stored charge from the updated total stored charge to obtain an absolute value (i.e., a non-negative value), dividing the absolute value by the updated total stored charge, and multiplying by 100. In other constructions, the comparison between the first predictive total stored charge and the updated total stored charge can be made in other ways (e.g., comparing the absolute value to a corresponding total stored charge threshold).

When the percentage difference between the updated total stored charge and the first predictive total stored charge is less than or equal to the first predetermined percentage threshold (i.e., "Yes" at step 245), the process returns to step 200. When the percentage difference between the updated total stored charge and the first predictive total stored charge at step 245 is greater than the first predetermined percentage threshold (i.e., "No" at step 245), the controller 105 resets the total stored charge to equal the first predictive total stored charge at step 250 and the process returns to step 200.

With regard to FIG. 3, when the controller 105 determines that the power sources 40, 90 are in the "Off" state at step 205 (i.e., "No" at step 205 in FIG. 2), no electrical charge is supplied to the batteries 95, 100 and the process moves to step 300. At step 300 the controller 105 determines whether the load is in the active state or the inactive state. When the load is in the inactive state (i.e., the load draw is zero), the controller 105 determines that the electrical storage system is in the standby phase and the process returns to step 200.

When the load is in the active state, the batteries 95, 100 are providing power to the load and the controller 105 determines that the electrical storage system 80 is in the discharge phase. At step 305 the controller 105 measures or detects the electrical charge or power out of the electrical storage system 80 for a second predetermined period of time (e.g., 5 minutes, 10 minutes, etc.) that may be the same or different from the first predetermined period of time. At step 310 the controller 105 updates the total stored charge of the batteries 95, 100 based on the total stored charge determined at step 205 and the electrical charge measured at step 305 (e.g., the electrical charge measured at step 305 is subtracted from the total stored charge determined at step 205).

The controller 105 determines a predictive run-time for the electrical storage system 80 at step 315 based on the updated total stored charge determined at step 310, the environment conditions, the time-related conditions, the operating conditions, and the load draw of the load. In other words, the controller 105 determines how long the current load will run or operate if powered only by the connected electrical storage system 80. In some constructions, the predictive run-time may be based on other or additional conditions of one or more of the vehicle 10, the load, and the electrical storage system 80. At step 320 the controller 105 reports the run-time to a user and compares the predictive run-time to a predetermined run-time threshold.

When the predictive run-time is below the predetermined run-time threshold at step 320 (i.e., "Yes at step 320), the process generates an alarm at step 325 that is indicative of a relatively low remaining run-time for the load. In response to the alarm generated at step 325, a user or operator can vary load operation (e.g., vary a compressor speed of the HVAC system 55, select a warmer interior temperature, manually switch between a normal and a maximum cooling mode of the air-conditioning system, park the vehicle 10 to take advantage of the surrounding environment, etc.) to extend the run-time of the load, if desired. Alternatively, the control system 85 or another control system can autonomously vary load operation to extend the run-time of the load.

When the predictive run-time is above or equal to the predetermined run-time threshold at step 320 (i.e., "No" at step 320), or after the alarm has been generated at step 325, the controller 105 measures or detects a change or difference in average voltage of the batteries 95, 100 over a first predetermined time interval at step 330 (e.g., $\Delta V/Time$, or average voltage change). The average voltage change of the batteries 95, 100 determined at step 330 is indicative of a discharging condition of the batteries 95, 100 that is affected by the environmental, time-related, and operating conditions. In other constructions, the controller 105 may determine other discharging conditions of the electrical storage system 80 at step 330.

At step 335 the controller 105 determines whether the average voltage change is greater than a predetermined voltage threshold. When the controller 105 determines that the average voltage change of the batteries 95, 100 is greater than the predetermined voltage threshold (i.e., "Yes" at step 335), the controller 105 determines a second predictive total stored charge at step 340 and resets the total stored charge of the batteries 95, 100 to equal the second predictive total stored charge and the process returns to step 200. The second predictive total stored charge is indicative of an end of charge life condition based on the end of charge life threshold, and provides an accurate determination of the total stored charge of the respective batteries 95, 100 when the batteries 95, 100 approach the end of charge life threshold. Generally, the second predictive total stored charge is a value representative of the actual total stored charge of the electrical storage element when the batteries 95, 100 approach the end of charge life threshold, and differs from the total stored charge that is updated at step 310 in that the second predictive total stored charge accounts for various conditions affecting the total stored charge of the batteries 95, 100. For example, the second predictive total stored charge can be determined based on the average voltage change measured at step 330, the environment conditions, the time-related conditions, the operating conditions, the measured electrical charge out of the electrical storage system 80 determined at step 305, and the total storage capacity of the batteries 95, 100. In some constructions, the second predictive total stored charge may be based on a formula or look-up table. In other constructions, the second predictive total stored charge may be based on other or additional criteria and data.

When the controller 105 determines that the average voltage change of the batteries 95, 100 is less than or equal to the predetermined voltage threshold (i.e., "No" at step 335), the controller 105 measures or detects a change or difference in average voltage of the batteries 95, 100 over a second predetermined time interval at step 350 (e.g., V/Time, or voltage average). The voltage average of the batteries 95, 100 determined at step 350 is indicative of another discharging condition of the batteries 95, 100 that is affected by the environmental, time-related, and operating conditions. In other constructions, the controller 105 may determine other discharging conditions of the electrical storage system 80 at step 350.

At step 355 the controller determines a third predictive total stored charge based on the voltage average measured at step 350, the environment conditions, the time-related conditions, the operating conditions, the measured electrical charge out of the electrical storage system 80 determined at step 305, and the total storage capacity of the batteries 95, 100. The third predictive total stored charge is indicative of relatively significant variations in the electrical charge discharged from the batteries 95, 100 during the discharge phase and can provide an accurate determination of the total stored charge of the respective batteries 95, 100 when the batteries 95, 100 are not near or approaching the end of charge life threshold.

Generally, the third predictive total stored charge differs from the total stored charge that is updated at step 310 in that the third predictive total stored charge accounts for various conditions affecting the total stored charge of the batteries 95, 100. In some constructions, the third predictive total stored charge may be based on a formula or look-up table. In other constructions, the third predictive total stored charge may be based on other or additional criteria and data. In still other constructions, the third predictive total stored charge may be determined or evaluated by the controller 105 before or simultaneously with the second predictive total stored charge.

At step 360 the controller 105 determines a difference between the updated total stored charge determined at step 310 and the third predictive total stored charge determined at step 355 and evaluates whether the difference between the total stored charges is less than or equal to a second predetermined percentage threshold (e.g., 10 percent). The second predetermined percentage threshold may be the same or different from the first predetermined percentage threshold. The difference between these total stored charges corresponds to a percentage difference that is determined by subtracting the third predictive total stored charge from the updated total stored charge determined at step 310 to obtain an absolute value (i.e., a non-negative value), dividing the absolute value by the updated total stored charge, and multiplying by 100. In other constructions, the comparison between the third predictive total stored charge and the updated total stored charge determined at step 310 can be made in other ways (e.g., comparing the absolute value to a corresponding total stored charge threshold).

When the percentage difference between the updated total stored charge and the third predictive total stored charge is less than or equal to the second predetermined percentage threshold (i.e., "Yes" at step 360), the process returns to step 200. When the percentage difference between the updated total stored charge and the third predictive total stored charge is greater than the second predetermined percentage threshold (i.e., "No" at step 360), the controller 105 resets the total stored charge to equal the third predictive total stored charge at step 365 and the process returns to step 200.

Upon subsequent iterations of the process described with regard to FIGS. 2 and 3, the total stored charge determined by the controller 105 at step 205 takes into account the total stored charge established by the prior iteration of the process (e.g., the updated total stored charge at step 220, the updated total stored charge at step 235, the first predictive total stored charge at step 250, the updated total stored charge at step 310, the second predictive total stored charge at step 345, or the third predictive total stored charge at step 365). In other words, the last total stored charge determined by the process prior to the process returning to step 200 can be used to determine the total stored charge at step 205. As discussed above, the state of charge may be updated and used in conjunction with the total storage capacity to provide an alternative to the total stored charge determined from the previous iteration of the process.

The discharging conditions determined by the controller 105 at steps 335 and 350 verify the run-time prediction that is determined at step 315 based on the total stored charge of the batteries in view of various conditions (e.g., the environmental conditions, the time-related conditions, the operating conditions, the load draw, etc.). In the event that the discharging conditions at steps 335 or 350 are indicative of a total stored charge that is significantly different from the updated total stored charge determined at step 310, the next iteration of the process incorporates the total stored charge associated with the relevant discharging condition to update the run-time prediction at step 315 of the next iteration. In this manner, an accurate and up-to-date run time prediction can be provided to the operator or used to autonomously adjust the load draw to maximize the run-time of the load.

Charging and discharging the electrical storage system 80 in the manner described with regard to FIGS. 1-3 provides updated and accurate information regarding the total stored charge of the batteries 95, 100 and conserves energy that is stored in the batteries 95, 100 to limit damage to the batteries 95, 100 that may otherwise occur when the batteries are substantially depleted of energy. The total stored charge and the load run-time prediction determined by the process of FIGS. 2 and 3 accurately predicts the charge available in the batteries 95, 100 and the amount of time that the load can draw power from the batteries 95, 100 without depleting the batteries beyond the battery life threshold. This information can be used by the operator or autonomously by the control system 85 to extend the run-time of the load.

Accurately determining the total stored charge of the batteries 95, 100 and the load run-time via this process limits depletion of the batteries 95, 100 beyond the corresponding battery life threshold, thereby maintaining or extending the cycle life of the batteries 95, 100. In particular, the total stored charge determinations made by this process are used to evaluate when one or more of the batteries 95, 100 should be removed from the load, as well as whether the batteries 95, 100 should be charged. The iterative process described herein actively protects and extends the cycle life of the batteries 95, 100 by repeatedly determining the state of the batteries 95, 100 based on various conditions, updating the load run-time based on the state of the batteries 95, 100, and modifying the total storage capacity based on the affect that these conditions have on the electrical storage potential of the batteries 95, 100 so that informed operational decisions can be made by one or both of the user and the control system 85.

Various features and advantages of the invention are set forth in the following claims.

What is claimed is:

1. A method of monitoring an electrical storage system for a vehicle having a power source and a load, the method comprising:
   providing an electrical storage element defining a total storage capacity and having a state of charge cooperatively defining a total stored charge of the electrical storage element;
   determining a total stored charge value representative of the total stored charge of the electrical storage element;
   determining a run-time of the load based on the total stored charge value;
   varying the total stored charge by charging the electrical storage element from the power source via an electrical charge or discharging the electrical storage element to the load via an electrical discharge;
   updating the total stored charge value after varying the total stored charge based on a measured quantity of at least one of the electrical charge and the electrical discharge;
   updating the run-time based on the updated total stored charge value;
   determining an average voltage of the electrical storage element over a first predetermined time;
   determining a voltage change of the electrical storage element over a second predetermined time;
   verifying the run time based on at least one of the average voltage and the voltage change;
   comparing the voltage change of the electrical storage element to a first threshold;
   determining a first predictive total stored charge value representative of the total stored charge of the electrical storage element based on the comparison of the voltage change to the first threshold;
   comparing the voltage average to a second threshold;
   determining a second predictive total stored charge value of the total stored charge of the electrical storage element based on the comparison of the voltage average to the second threshold; and
   updating the total stored charge value based on one of the first predictive total stored charge value and the second predictive total stored charge value in response to one of the voltage change and the voltage average exceeding the respective first and second thresholds.

2. The method of claim 1, further comprising
   determining whether the electrical storage element is in one of a charge phase and a discharge phase;
   determining at least one of a charging condition associated with the charge phase and a discharging condition associated with the discharge phase; and
   updating the total stored charge value of the electric storage element based on the charging condition.

3. The method of claim 2, wherein updating the total stored charge value includes accounting for at least one of environment conditions adjacent the electrical storage element and an age of the electrical storage element.

4. The method of claim 1, further comprising generating an alarm when the run-time drops below a predetermined threshold.

* * * * *